(12) United States Patent
Cohn et al.

(10) Patent No.: US 6,479,974 B2
(45) Date of Patent: Nov. 12, 2002

(54) STACKED VOLTAGE RAILS FOR LOW-VOLTAGE DC DISTRIBUTION

(75) Inventors: John Maxwell Cohn, Richmond, VT (US); Alvar Antonio Dean, Essex Junction, VT (US); David James Hathaway, Underhill Center, VT (US); Patrick Edward Perry, Shelburne, VT (US); Sebastian Theodore Ventrone, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/750,884

(22) Filed: Dec. 28, 2000

(65) Prior Publication Data

US 2002/0084824 A1 Jul. 4, 2002

(51) Int. Cl.[7] .............................. G05F 3/04; H02J 1/00
(52) U.S. Cl. ................................... 323/312; 327/530
(58) Field of Search ................................ 323/312, 313, 323/314, 315; 327/530, 415, 72, 77, 538

(56) References Cited

U.S. PATENT DOCUMENTS

| | | | | |
|---|---|---|---|---|
| 4,767,942 A | * | 8/1988 | Minami et al. | 307/304 |
| 5,534,801 A | * | 7/1996 | Wu et al. | 327/72 |
| 5,689,460 A | * | 11/1997 | Ooishi | 365/189.07 |
| 5,712,586 A | * | 1/1998 | Kitao | 327/333 |
| 5,798,918 A | | 8/1998 | Georgiou et al. | |
| 6,031,406 A | | 2/2000 | Drost et al. | |
| 6,081,108 A | | 6/2000 | Marshall | |
| 6,133,779 A | | 10/2000 | Sichert et al. | |

* cited by examiner

*Primary Examiner*—Rajnikant B. Patel
(74) *Attorney, Agent, or Firm*—Richard A. Henkler; Bracewell & Patterson, L.L.P.

(57) ABSTRACT

A system and method for providing on-chip voltage distribution and regulation. In accordance with the system of the present invention, an IC chip includes a source voltage plane having a source supply rail for supplying power to the IC chip and a source ground rail for sinking power supplied therefrom. At least one intermediate ground rail is connected between the source supply rail and the source ground rail to divide the source voltage plane into multiple intermediate voltage planes. The intermediate ground rail serves as a supply rail for a subsequent intermediate voltage plane such that the intermediate voltage planes are series-connected.

12 Claims, 3 Drawing Sheets

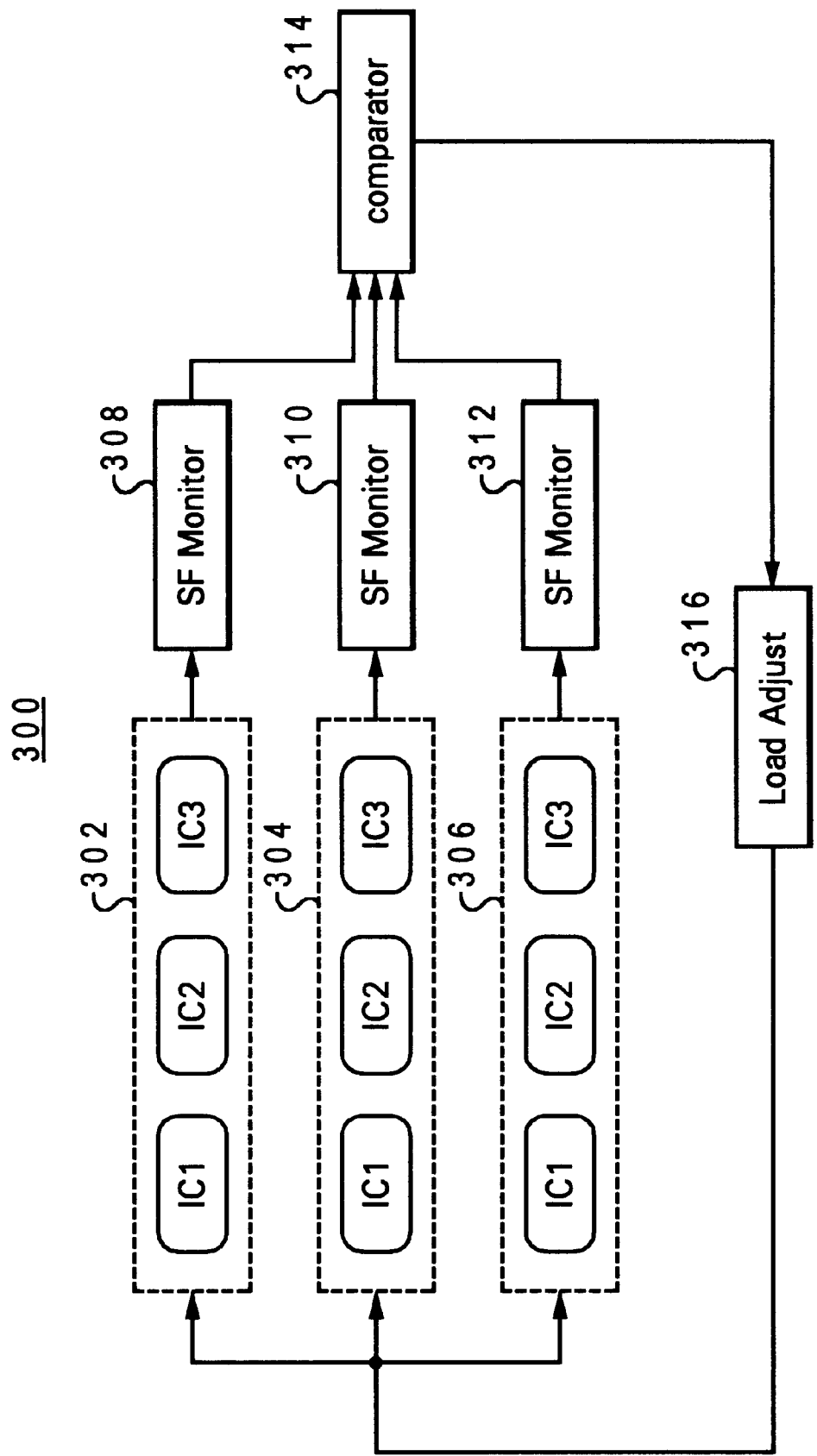

STACKED VOLTAGE RAILS FOR LOW-VOLTAGE DC DISTRIBUTION

BACKGROUND OF THE INVENTION

1. Technical Field

The present invention relates in general to power distribution within an integrated circuit (IC) chip, and in particular to an apparatus and method for improving DC distribution efficiency for IC applications. More particularly, the present invention relates to an on-chip, multi-plane voltage distribution system for efficiently scaling external power boundaries for use with low-voltage devices.

2. Description of the Related Art

With switching thresholds in the tenths of a volt region for sub-micron IC devices, the trend in power supply technology is toward lower supply voltage levels. To meet such low-power requirements, application board supply voltages as low as 1.2 volts DC are becoming commonplace. While reducing on-chip power consumption, however, such low supply voltages are achieved at a substantial cost in power supply overhead hardware that is required for additional DC-to-DC conversion stages. In addition, the electrical efficiency of low output voltage power supplies suffers due to the additional voltage regulation required for providing application-board-level voltages from DC distribution buses.

Most power supplies are required to support a variety of data processing system requirements in addition to those of internal microcircuits. For a personal computer, such additional requirements may include, for example, the power supply fan, magnetic and optical disk drivers, and input/output (I/O) bus support. Power supplies for larger scale data processing systems may be required to support multiple disk arrays, telecommunication infrastructure, and the like. The vast disparity between the voltage levels required for these applications and the IC chip voltage levels further increases power supply overhead hardware requirements and reduces power supply efficiency.

AC source power supplies operate more efficiently at higher voltages as both a consequence of having fewer voltage level conversion stages and lower current losses. For batteries, the lower current levels afforded by higher operating voltages similarly results in higher output efficiency as well as extending battery life.

To meet disparate power supply requirements from applications that demand high power density, low power consumption, and high efficiency, power supplies for high-level data processing systems, such as network servers, must often be custom designed. Significant development time and resources are required to support such customization for systems having individualized power requirements. Since the design and construction of a custom power supply presumably overlaps the design phase of the data processing system, supply capacity requirements may have to be adjusted, resulting in an overall delay in product development.

From the foregoing, it can be appreciated that a need exists for an on-chip DC power distribution system that will provide relief for the low-voltage conversion requirements of multi-purpose power supplies.

SUMMARY OF THE INVENTION

An apparatus and method for providing on-chip voltage distribution and regulation are disclosed herein. In accordance with a preferred embodiment of the present invention, an IC chip includes a source voltage plane having a source supply rail for supplying power to the IC chip and a source ground rail for sinking power supplied therefrom. At least one intermediate ground rail is connected between the source supply rail and the source ground rail to divide the source voltage plane into multiple intermediate voltage planes. The intermediate ground rail serves as a supply rail for a subsequent intermediate voltage plane such that the intermediate voltage planes are connected in series.

All objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 3 is a block diagram depicting an inter-plane load balance circuit applicable within the DC distribution system of FIG. 1.

DETAILED DESCRIPTION OF THE PREFERRED EMBODIMENT

This invention is described in a preferred embodiment in the following description with reference to the figures. While this invention is described in terms of the best mode for achieving this invention's objectives, it will be appreciated by those skilled in the art that variations may be accomplished in view of these teachings without deviating from the spirit or scope of the present invention.

Figure 1:
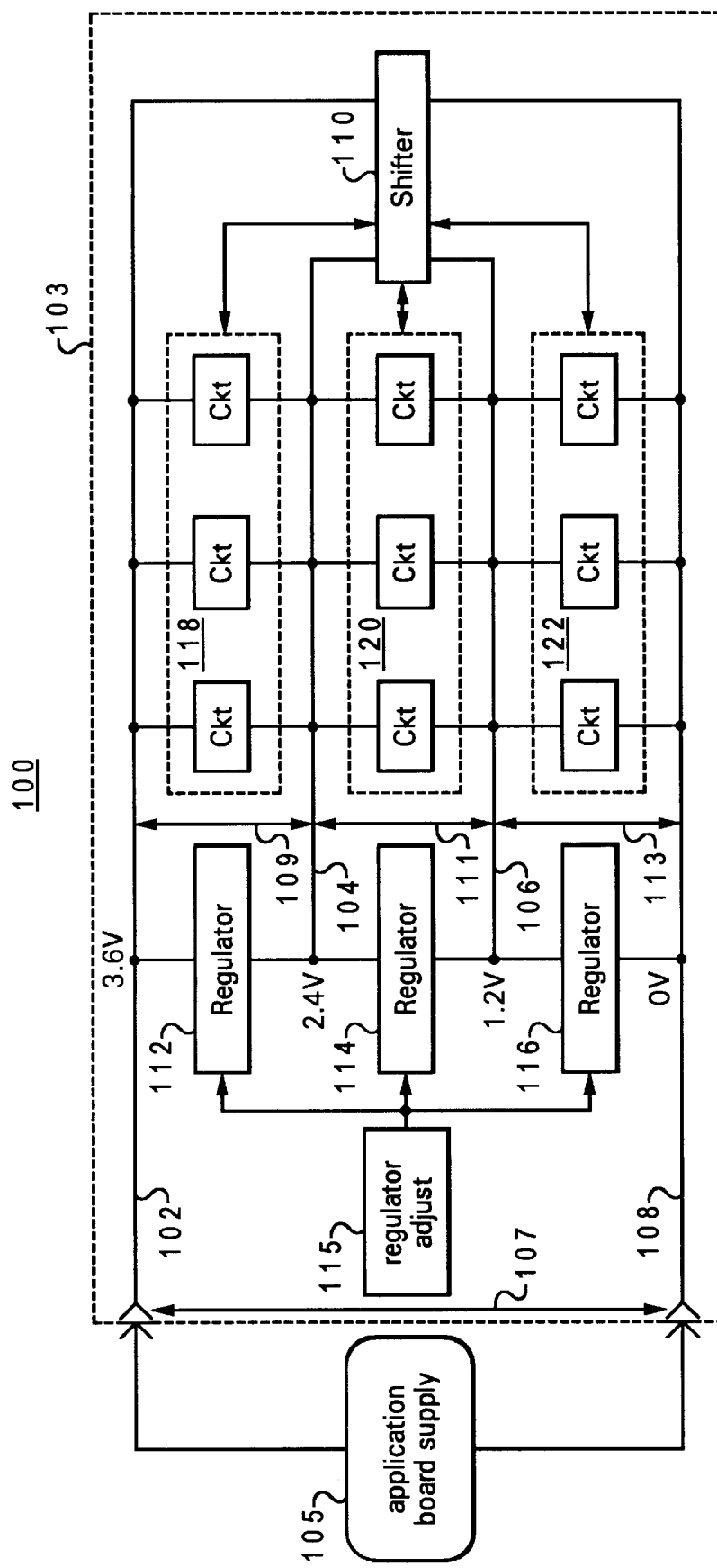
FIG. 1 is a block diagram depicting a DC distribution system in accordance with a preferred embodiment of the present invention.

With reference now to the figures, and in particular with reference to FIG. 1, there is illustrated a block diagram depicting a DC distribution system 100 in accordance with a preferred embodiment of the present invention. DC distribution system 100 includes a source voltage plane 107 comprising a source supply rail 102 that provides a conductive medium for supplying a 3.6 VDC source to an IC chip 103 from an application board power supply 105. Source voltage plane 107 is terminated by a source ground rail 108 which sinks power supplied from application board power supply 105.

As further depicted in FIG. 1, DC distribution system 100 further includes two intermediate ground rails 104 and 106 that, in accordance with the teachings of the present invention, divide source voltage plane 107 into multiple series-connected intermediate voltage planes 109, 111, and 113. In the depicted embodiment, the 3.6 VDC source voltage supplied from source supply rail 102 is dropped in identical 1.2 VDC increments across each of intermediate voltage planes 109, 111, and 113. The intra-plane 1.2 VDC drop is maintained within each intermediate voltage plane by voltage regulators 112, 114, and 116.

Each of voltage regulators 112, 114, and 116 include circuitry for continuously holding the intra-plane voltage to the design value of 1.2 VDC regardless of changes in load current or input voltage. In accordance with well-known linear voltage regulator operating principles, a voltage-controlled current source is utilized to force a fixed voltage across the regulator output terminal. Typically, such a voltage regulator employs a control circuit comprising an output sensing resistor in parallel with the regulator output. A feedback loop is used to monitor the voltage across the sense resistor and deliver this voltage level to the voltage-controlled current source which adjusts the level of current delivered through the sense resistor to hold the regulator output to the desired level.

The 1.2 VDC dropped across each of intermediate voltage planes 109, 111, and 113, provides the required DC voltage levels for multiple circuit blocks 118, 120, and 122 within IC chip 103. A central feature of the distribution system depicted in FIG. 1 is that intermediate voltage planes 109, 111, 113, although independently regulated, form a mutually dependent voltage stack having three "floors" and three "ceilings." Within the stack, intermediate voltage planes 109, 111, and 113 are connected in series. Source supply rail 102 serves as the top ceiling for intermediate voltage plane 109, while source ground rail 108 is the bottom floor for intermediate voltage plane 113. Intermediate ground rails 104 and 106 serve as both the floors for voltage planes 109 and 111 respectively, and as the ceilings for subsequent voltage planes 111 and 113 respectively.

DC distribution system 100 thus scales the incoming source 3.6 VDC into ranges of 3.6 VDC–2.4 VDC, 2.4 VDC–1.2 VDC, and 1.2 VDC–0 VDC for intermediate voltage planes 109, 111, and 113, respectively. Such on-chip scaling relieves application board power supply 105 from the low-voltage DC conversion that would otherwise be required to supply circuit blocks 118, 120, and 122. It should be noted that although DC distribution system 100 is depicted as having uniform 1.2 VDC planes, alternate embodiments may have different intra-plane voltage levels and/or may have non-uniform inter-plane levels as required by the application.

DC distribution system 100 further comprises a regulator adjustment device 115 connected to each of voltage regulators 112, 114, and 116. Regulator adjustment device 115 serves to increase overall power distribution efficiency within DC distribution system 100 by minimizing the amount of current utilized for regulatory purposes within voltage regulators 112, 114, and 116. As explained in further detail hereinbelow, regulator adjustment device 115 senses and compares the relative current levels drawn by each voltage regulator. The results of such current output comparisons is utilized to adjust individual regulator current draw and to maintain the highest practicable power efficiency for DC distribution system 100.

In one embodiment, regulator device 115 is utilized to ensure that at any given time, at least one voltage regulator is drawing no current. To this end, regulator device 115 includes circuitry for monitoring the current drawn by each of the voltage regulators. Assume for example, that one amp of current is drawn across each of the serially connected voltage planes. Assuming further that circuit block 118 is currently drawing one amp, while circuit blocks 120 and 122 are each drawing one-half amp, voltage regulator 112 will not be sinking any current while voltage regulators 114 and 116 will each sink one-half amp.

If the load drawn by circuit block 120 increases to 0.75 amps, regulator adjustment device 115 detects the corresponding increase in the current drawn by voltage regulators 112 and 116 in an attempt to bring the total current drawn through the voltage planes to 1.25 amps. In accordance with a preferred embodiment of the present invention, regulator adjustment device 115 further includes any combination of software, firmware, and hardware for upon detecting a non-zero current draw from currently inactive voltage regulator 112, in addition to the increased current draw by voltage regulator 116, and reduces the current drawn by regulator 114 to maintain the current drawn through the voltage planes to one amp.

A level shifter 110 is further included within DC distribution system to facilitate inter-plane communication between circuit blocks 118, 120, and 122. As depicted in FIG. 1, level shifter 110 receives the respective voltage levels from each of rails 102, 104, 106, and 108. As explained in further detail with reference to FIGS. 2A, 2B, and 2C, level shifter 110 utilizes these voltage levels to provide a signaling interface between circuits blocks 118, 120, and 122. It should be noted that although level shifter 110 is depicted as a separate, discrete unit in FIG. 1, level shifting devices such as those shown in FIGS. 2A, 2B, and 2C, may be implemented in a distributed manner within the voltage planes.

Figure 2A:
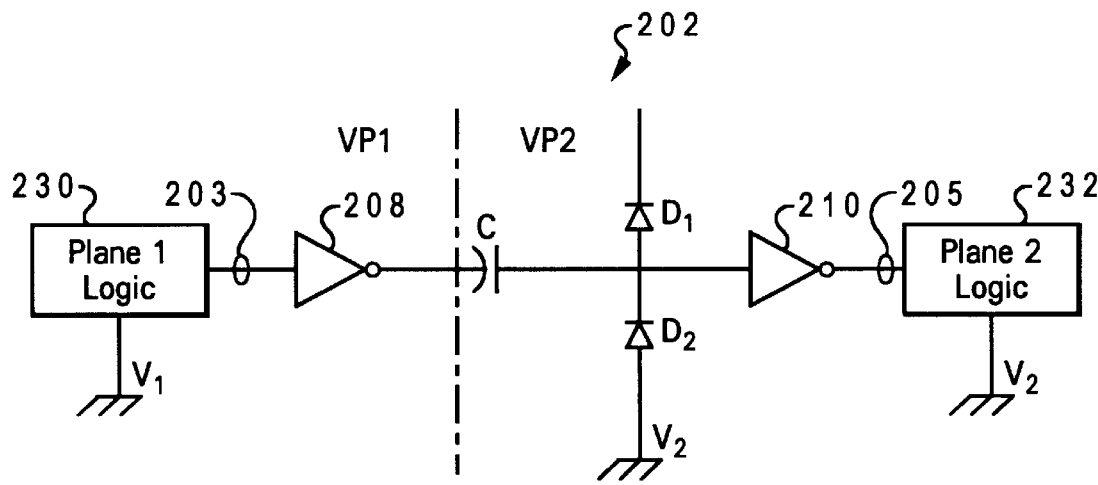
FIG. 2A illustrates a level shifter device applicable within the DC distribution system of FIG. 1, in accordance with a first embodiment of the present invention.
Figure 2B:
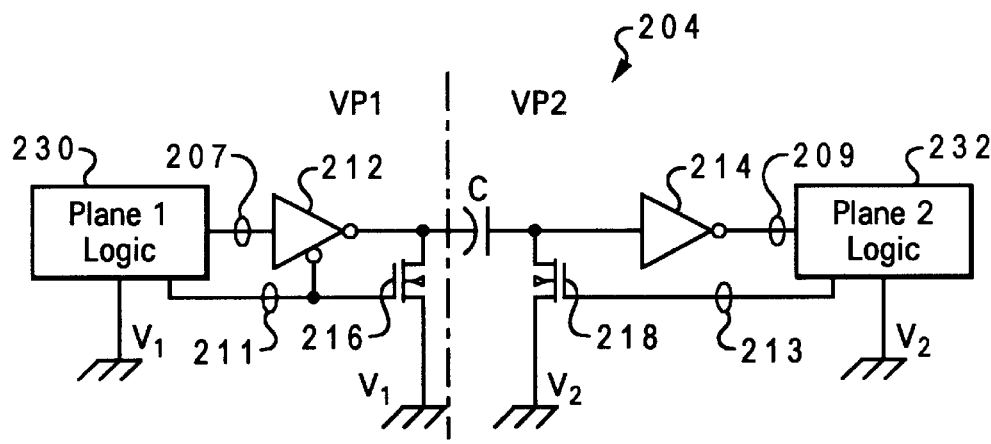
FIG. 2B depicts a level shifter device applicable within the DC distribution system of FIG. 1, in accordance with a second embodiment of the present invention.
Figure 2C:
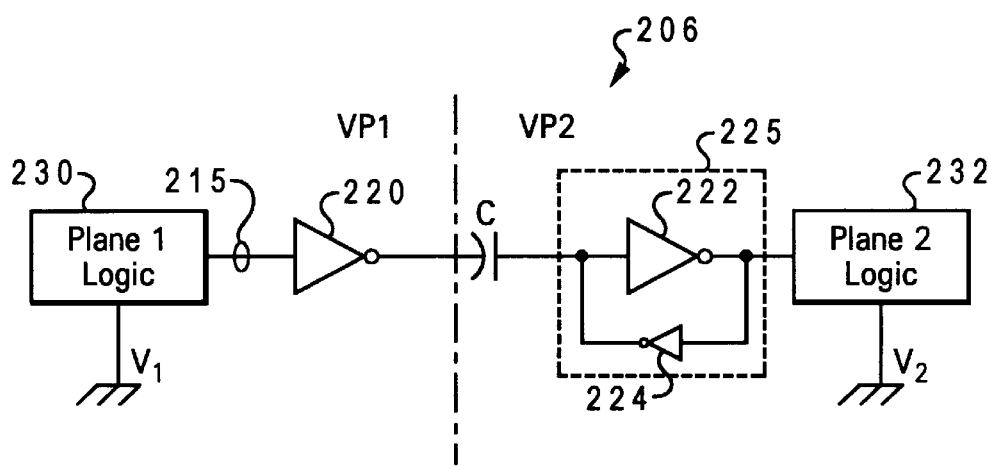
FIG. 2C illustrates a level shifter device applicable within the DC distribution system of FIG. 1, in accordance with a third embodiment of the present invention.

Turning now to FIGS. 2A, 2B, and 2C, there are illustrated three alternate level shifter devices that are applicable within a system similar to DC distribution system 100 in alternative embodiments of the present invention. FIG. 2A depicts a level shifter device 202 that may be advantageously utilized for providing inter-plane delivery of clock signals or other signals expected to make frequent rail-to-rail transitions. As illustrated in FIG. 2A, level shifter device 202 is connected between a first voltage plane, VP1, in which a plane1 logic device 230 resides, and a second voltage plane, VP2, in which a plane2 logic device 232 resides.

Level shifter device 202 receives an interplane signal at input 203 from a sending circuit within plane1 logic 230 that is analogous to one of intermediate voltage planes 109, 111, or 113. After passing through input buffer device 208, the signal passes through a coupling capacitor, C, which maintains DC isolation between the disparate voltage reference levels on sending and receiving voltage planes. Assuming that plane1 logic 230 resides within intermediate plane 109 (FIG. 1), for example, its ground would be 2.4 VDC. If plane2 logic 232 is part of intermediate plane 113, its ground will be at 0 VDC. For higher frequency applications, capacitor C ensures that the 1.2 VDC differential (or whatever inter-plane voltage differential is applicable) is maintained between VP1 and VP2.

A clamper circuit comprising diodes $D_1$ and $D_2$ is employed on the output side of coupling capacitor C for clamping the clock signal to the DC level of the voltage plane on the output side of C before passing through an output buffer 210. The design simplicity of level shifter device 202 makes it attractive for higher frequency inter-plane signal transmissions.

Referring to FIG. 2B, there is illustrated a level shifter device 204 that is suited for inter-plane delivery of signals that do not make frequent rail-to-rail transitions. As with the embodiment illustrated in FIG. 2A, level shifter device 204 includes coupling capacitor C for providing DC isolation between the disparate chassis ground levels on VP1 and VP2. A tri-state inverter 212 receives an incoming interplane transmission signal at input 207 from a sending circuit within plane1 logic 230. A clock signal that is applied to a control input 211 of tri-state inverter 212 serves to determine when tri-state inverter 212 is enabled to pass the incoming signal to coupling capacitor C.

In a preferred embodiment, the activation of clock signal at control input 211 is selectively controllable to correspond with the arrival of a data signal at input 207. A pair of NFETs switching devices 216 and 218 are coupled across both the input and output sides of coupling capacitor C. NFETs 216 and 218 are controllably switched on and off by the clock signals at control inputs 211 and 213. When the clock signals at control inputs 211 and 213 are de-asserted, NFETs 216 and 218 drive both sides of C to a known voltage (ground in the depicted example).

A third variation of level shifting is illustrated in FIG. 2C in which, as for the embodiment depicted in FIG. 2B, is better suited for lower frequency applications. This embodiment employs a level shifter 206 that maintains a last known output state on the output side of coupling capacitor C without the need for synchronization control clocks. Instead, an output latch 225 comprising a feedforward inverter 222 and weak feedback inverter 224, is utilized to capture and hold a last state for intermittent data delivered through input buffer 220 from the sending circuit.

When the loads drawn by the functional circuitry in each of the voltage planes is optimally balanced, the collective current drawn by the voltage regulators (depicted in FIG. 1) within the intermediate voltage planes is minimized thus improving overall power distribution efficiency. To address power efficiency concerns, the present invention includes a load balancing feature that as explained in further detail with reference to FIG. 3, may encompasses a variety of possible implementations.

With reference now to FIG. 3, there is illustrated a block diagram depicting an inter-plane load balance circuit 300 applicable within the DC distribution system shown in FIG. 1. As illustrate in FIG. 3, inter-plane load balance circuit 300 includes three voltage planes 302, 304, and 306 that are analogous to intermediate voltage planes 109, 111, and 113 in DC distribution system 100.

Each of voltage planes 302, 304, and 306 includes functional circuits IC1, IC2, and IC3 that serve as the functional (non-regulatory) load within each plane. In accordance with a preferred embodiment of the present invention, load balance circuit 300 employs switching factor monitors 308, 310, and 312 for determining the load drawn by the functional circuitry within voltage planes 302, 304, and 306 respectively.

Switching factor monitors 308, 310, and 312 include a combination of hardware and software for determining the switching factor for the functional circuitry within each of voltage planes 302, 304, and 306. As utilized herein, "switching factor" refers to the average number of transistor switches per cycle for a given block of logic. In accordance with the depicted embodiment, the resultant switching factor determined for voltage planes 302, 304, and 306, are each quantified as an output voltage level at the outputs of switching factor monitors 308, 310, and 312.

Inter-plane load balance circuit 300 further includes a comparator device 314 for comparing the output voltage levels from switching factor monitors 308, 310, and 312. The result of the load comparison is then transmitted to a load adjust device 316 that provides load balance feedback for balancing the load among the functional circuitry across voltage planes 302, 304, 306.

In one embodiment, load adjust device 316 includes computer program code instructions (software or firmware) designed to balance the switching factors among the voltage planes in accordance with feedback from comparator 314. In an alternate embodiment, an optimal load balance among the voltage planes is achieved by duplicating the logic between the planes such that load adjust device 316 may be utilized to activate one or more of the duplicate copies of the logic at any given time in accordance with load feedback. In response to a detected interplane load imbalance, load adjust device 316 selectively activates a duplicated logic unit within a plane in which the non-regulatory circuitry is sinking less power and possibly deactivates the corresponding unit in a plane having a higher non-regulatory draw. A suitable control algorithm may be implemented within load adjust device 316 to provide such selective activation/deactivation.

While the invention has been particularly shown and described with reference to a preferred embodiment, it will be understood by those skilled in the art that various changes in form and detail may be made therein without departing from the spirit and scope of the invention.

What is claimed is:

1. In an integrated circuit, a voltage distribution circuit for providing at least three voltage planes, the voltage distribution circuit comprising:
   a source power rail;
   a ground power rail;
   a first intermediary voltage plane coupled in series with the source power rail;
   a second intermediary voltage plane coupled in series with he first intermediary voltage plane; and
   a third intermediary voltage plane coupled in series with the second intermediary voltage plane.

2. The voltage distribution circuit of claim 1 wherein each one of the voltage planes includes a voltage regulator for maintaining the voltage level of the corresponding voltage plane.

3. The voltage distribution circuit of claim 2 further comprising:
   a regulator adjustment circuit for adjusting the current draw of each one of the voltage regulators.

4. The voltage distribution circuit of claim 3 further comprising:
   a communication circuit for providing communication between circuits residing on differing voltage planes.

5. The voltage distribution circuit of claim 1 wherein the first intermediary voltage plane comprises the source power rail and a first intermediate ground rail located between the source power rail and the source ground rail.

6. The voltage distribution circuit of claim 5 wherein the second intermediary voltage plane comprises the first intermediate ground rail and a second intermediate ground rail located between the first intermediate ground rail and the source ground rail.

7. The voltage distribution circuit of claim 6 wherein the third intermediary voltage plane comprises the second intermediate ground rail and the source ground rail.

8. The voltage distribution circuit of claim 7 wherein each one of the voltage planes includes a voltage regulator for maintaining the voltage level of the corresponding voltage plane.

9. In an integrated circuit, a voltage distribution circuit comprising:

a source power rail;

a source ground rail;

a first voltage plane having a first intermediate ground rail located between the source power rail and the source ground rail, and a voltage regulator located between the source power rail and the first intermediate ground rail; and a second voltage plane having a second intermediate ground rail located between the first intermediate ground rail and the source ground rail, and a voltage regulator located between the first intermediate ground rail and the second intermediate ground rail.

10. The voltage distribution circuit of claim 9 further comprising:

a third voltage plane having a voltage regulator located between the second intermediate ground rail and the source ground rail.

11. The voltage distribution circuit of claim 10 further comprising:

an adjuster circuit for adjusting the current drawn by each one of the voltage regulators.

12. The voltage distribution circuit of claim 11 further comprising:

a communication circuit for providing communication between circuits residing on differing voltage planes.

* * * * *